US011139297B2

(12) United States Patent
Kahrimanovic

(10) Patent No.: US 11,139,297 B2
(45) Date of Patent: Oct. 5, 2021

(54) CIRCUIT ARRANGEMENT, REDISTRIBUTION BOARD, MODULE AND METHOD OF FABRICATING A HALF-BRIDGE CIRCUIT

(71) Applicant: Infineon Technologies Austria AG, Villach (AT)

(72) Inventor: Elvir Kahrimanovic, Villach (AT)

(73) Assignee: Infineon Technologies Austria AG, Villach (AT)

(*) Notice: Subject to any disclaimer, the term of this patent is extended or adjusted under 35 U.S.C. 154(b) by 0 days.

(21) Appl. No.: 16/358,309

(22) Filed: Mar. 19, 2019

(65) Prior Publication Data

US 2019/0296014 A1  Sep. 26, 2019

(30) Foreign Application Priority Data

Mar. 21, 2018  (EP) .................... 18163094

(51) Int. Cl.
| | | |
|---|---|---|
| *H01L 27/092* | (2006.01) | |
| *H01L 23/495* | (2006.01) | |
| *H03K 17/687* | (2006.01) | |
| *H02M 7/00* | (2006.01) | |
| *H01L 23/00* | (2006.01) | |
| *H02M 7/493* | (2007.01) | |

(52) U.S. Cl.
CPC .... *H01L 27/0922* (2013.01); *H01L 23/49531* (2013.01); *H01L 23/49575* (2013.01); *H01L 24/00* (2013.01); *H02M 7/003* (2013.01); *H02M 7/493* (2013.01); *H03K 17/6871* (2013.01); *H01L 2224/0603* (2013.01); *H01L 2224/40245* (2013.01); *H01L 2224/48091* (2013.01); *H01L 2224/48247* (2013.01); *H01L 2224/73265* (2013.01); *H01L 2924/00014* (2013.01); *H01L 2924/15747* (2013.01); *H01L 2924/181* (2013.01)

(58) Field of Classification Search
None
See application file for complete search history.

(56) References Cited

U.S. PATENT DOCUMENTS 6,384,492 B1 * 5/2002 Iversen ................. H01L 25/162
                                                  307/147
7,619,325 B1   11/2009 Hennessy et al.
(Continued)

FOREIGN PATENT DOCUMENTS

EP        0645815 A2    3/1995

*Primary Examiner* — Long Pham
(74) *Attorney, Agent, or Firm* — Murphy, Bilak & Homiller, PLLC

(57) ABSTRACT

In an embodiment, a circuit arrangement is provided that includes a half-bridge circuit and a substrate having a major surface. The half-bridge circuit includes a high voltage node, a low voltage node and an output node. A high side switch and a low side switch are coupled in series and provide a pair and n pairs are coupled in parallel between the high voltage node and the low voltage node, n being an integer greater than or equal to 2. The output node is provided by an output connector on the major surface of the substrate. The output connector has an axis perpendicular to the major surface of the substrate and the n pairs are arranged on the major surface of the substrate and are uniformly distributed around the axis of the output connector.

12 Claims, 9 Drawing Sheets

(56) References Cited

U.S. PATENT DOCUMENTS

| | | |
|---|---|---|
| 2005/0122072 A1 | 6/2005 | Atmur |
| 2016/0284683 A1* | 9/2016 | Takao ................. H01L 29/7805 |
| 2016/0285445 A1* | 9/2016 | Takao ................... H02M 7/537 |
| 2017/0019033 A1 | 1/2017 | Ohno et al. |
| 2019/0296014 A1* | 9/2019 | Kahrimanovic ... H03K 17/6871 |

* cited by examiner

CIRCUIT ARRANGEMENT, REDISTRIBUTION BOARD, MODULE AND METHOD OF FABRICATING A HALF-BRIDGE CIRCUIT

BACKGROUND

In some applications, such as power conversion, for example DC/DC conversion or AC/DC conversion, transistor devices, such as MOSFET (Metal Oxide Semiconductor Field Effect Transistor) devices or IGBT (Insulated Gate Bipolar Transistor) devices are coupled to form a switching circuit or part of a switching circuit, for example a half-bridge circuit. Some power applications require switching of a current that is greater than the maximum current that an individual transistor device can switch. In such applications, multiple transistor devices may be coupled in parallel to increase the current carrying capability of the circuit.

The document US 2005/0122072 A1 discloses apparatus for power scaling a drive assembly for a brushless direct current motor. The apparatus includes multiple groups of half-bridge assemblies connected to respective "In-Hand" phase windings of the motor. By effectively paralleling groups of half-bridge assemblies connected to respective In-Hand windings, the current delivered to the phase windings can be greater than the individual current capability of the switching elements in the half-bridge assemblies.

Further improvements to circuits and components comprising half-bridge assemblies coupled in parallel are desirable.

SUMMARY

In an embodiment, a circuit arrangement is provided that comprises a half-bridge circuit and a substrate having a major surface. The half-bridge circuit comprises a high voltage node, a low voltage node and an output node. A high side switch and a low side switch are coupled in series and provide a pair and n pairs are coupled in parallel between the high voltage node and the low voltage node, n being an integer greater than or equal to 2. The output node is provided by an output connector on the major surface of the substrate. The output connector has an axis perpendicular to the major surface of the substrate and the n pairs are arranged on the major surface of the substrate and are uniformly distributed around the axis of the output connector.

In some embodiments, the n pairs are arranged on the major surface of the substrate around the axis such that adjacent ones of the n pairs are rotated by and angle $\alpha$ about the axis, where $\alpha = 360°/n$.

In some embodiments, a shortest line of sight between the high side switch and the output connector of the n pairs is substantially the same and such that a shortest line of sight between the low side switch and the output connector of the n pairs is substantially the same.

In some embodiments, the high side switches and low side switches are arranged alternately around the axis of the output connector.

In some embodiments, the high side switch and the low side switch comprise an indicator, wherein the indicators of the high side switch and the low side switch of each pair face in opposing lateral directions.

In some embodiments, the low side switch is provided by a transistor device having a drain terminal, a source terminal and a gate terminal and an edge of the drain terminal of each low side switch faces towards the output connector.

The circuit arrangement may further comprise bypass capacitors, wherein each pair is associated with two bypass capacitors and the two bypass capacitors are arranged on opposing lateral sides of a low voltage connector of the low voltage node. The circuit arrangement may also further comprise one or more driver circuits, wherein the driver circuits are mounted on a driver substrate that is stacked on the substrate, and/or capacitors, wherein the capacitors are mounted on a capacitor substrate that is stacked on the substrate.

In an embodiment, a redistribution board is provided that comprises the circuit arrangement of any one of the embodiments described herein. Each high side switch is provided by a packaged transistor device and each low side switch is provided by a packaged transistor device.

In an embodiment, a module is provided that comprises the circuit arrangement of any one of the embodiments described herein. The high side switch is provided by a bare transistor device die and the low side switch is provided by a bare transistor device die.

In an embodiment, a method of fabricating a circuit arrangement for a half-bridge circuit is provided. The method comprises providing an output connector on a substrate, the output connector providing an output node of the half-bridge circuit and having an axis that is perpendicular to a major surface of the substrate, arranging n high side switches on the major surface of the substrate such that an angle $\alpha$ formed between adjacent ones of the high side switches with respect to the axis is $360°/n$, n being an integer greater than or equal to 2, and arranging n low side switches on the major surface of the substrate such that an angle $\alpha$ formed between adjacent ones of the low side switches with respect to the axis is $360°/n$. The low side switches and the high side switches are arranged alternately around the axis of the output connector.

In some embodiments, the method further comprises coupling one of the n high side switches in series with one of the n low side switches to form one pair of switches having an output node, forming n pairs of switches, each pair comprising a high side switch coupled in series with a low side switch and an output node, coupling the n pairs of switches in parallel between a high side node and a low voltage node, and coupling the output nodes of the n pairs to a common output connector.

In some embodiments, wherein the n high side switches are arranged on the major surface of the substrate so that a shortest line of sight between the high side switches and the output connector is substantially the same and the n low side switches are arranged on the substrate such that a shortest line of sight between the low side switches and the output connector is substantially the same.

The high side switches and the low side switches may each comprise an indicator and the method may further comprise arranging neighbouring high side switches and low side switches on the major surface of the substrate such that the indicators of the high side switch and the low side switch of each pair face in opposing lateral directions.

In some embodiments, each low side switch is provided by a transistor device having a drain, a source and a gate and each high side switch is provided by a transistor device having a drain, a source and a gate. The method may further comprise coupling the drain of the n high side switches in parallel to the high voltage node, coupling the source of the n low side switches in parallel to the low voltage node, and coupling the drain of the low side switches and the source of the high side switches to the output connector.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Exemplary embodiments are depicted in the drawings and are detailed in the description which follows.

DETAILED DESCRIPTION

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of exemplary embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or a substrate. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or substrate.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

As employed in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1:
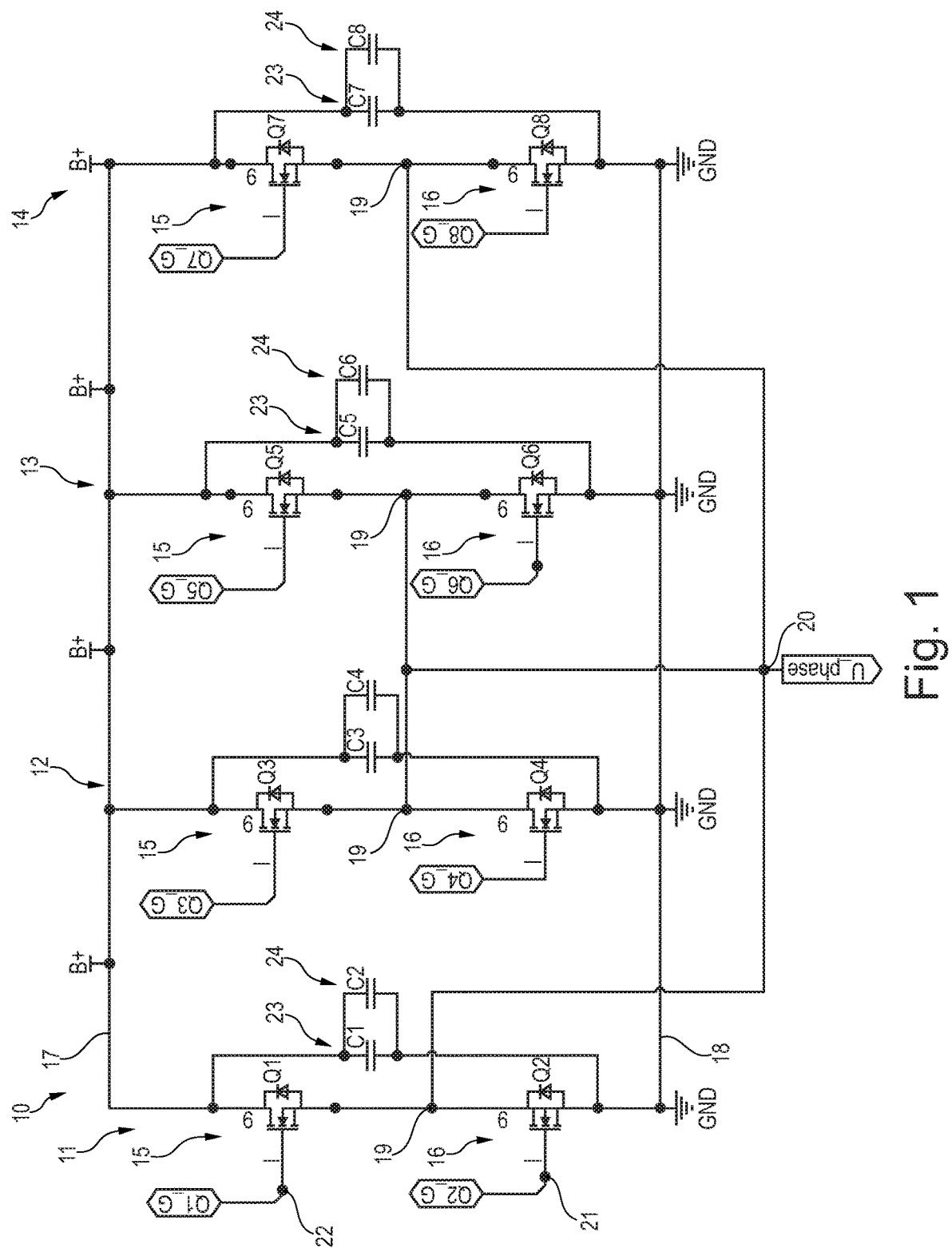
FIG. 1 illustrates a circuit diagram of a half-bridge circuit including multiple transistor devices coupled in parallel.

FIG. 1 illustrates a circuit diagram of a half-bridge circuit 10 including multiple switches in parallel.

In the embodiment illustrated in FIG. 1, the half-bridge 10 includes eight switches Q1 to Q8 coupled in parallel. The half-bridge circuit 10 includes four pairs 11, 12, 13, 14 of switches, with the two switches of each pair 11, 12, 13, 14, being coupled in series. For example the pair 11 includes switches Q1 and Q2 coupled in series and the pair 12 includes the switches Q3 and Q4 coupled in series. Each pair 11, 12, 13, 14 of switches is coupled in parallel between a high voltage node 17 and low voltage node 18 which, in the illustrated embodiment, is ground. The node 19 formed between the serially coupled switches of each pair 11, 12, 13, 14 is coupled to a common output node 20.

Each switch Q1 to Q8 may be provided by a transistor device, whereby the transistor devices 15, 16 of each pair 11, 12, 13, 14 are coupled in series. The switches Q1 to Q8 may each comprise a transistor device 15, 16 such as a MOSFET device, Insulated Gate Bipolar Transistor (IGBT) device or a bipolar junction transistor (BJT) device.

As used herein, each of the transistor devices 15, 16 includes a source, a drain and a gate. As used herein, the electrodes or terminals of the transistor device are referred to as source, drain and gate. Therefore, these terms also encompass the functionally equivalent terminals of other types of devices, such as an insulated gate bipolar transistor. For example, as used herein, the term "source" encompasses not only a source of a MOSFET device but also an emitter of an insulator gate bipolar transistor (IGBT) device and an emitter of a BJT device, the term "drain" encompasses not only a drain of a MOSFET device but also a collector of an insulator gate bipolar transistor (IGBT) device and a collector of a BJT device, and the term "gate" encompasses not only a gate of the MOSFET device but also a gate of an insulator gate bipolar transistor (IGBT) device and a base of a BJT device.

In some embodiments, each switch Q1 to Q8 includes a single transistor device such as a MOSFET device or may include a transistor device, such as a IGBT device, coupled in parallel with a diode.

Each pair 11, 12, 13, 14 includes a high side switch, Q1, Q3, Q5, Q7 and a low side switch Q2, Q4, Q6, Q8 coupled in series. Each pair may be considered to be a half-bridge assembly. Referring to the pair 11 of transistor devices 15, 16, the transistor device 15 provides the high side switch and the transistor device 16 the low side switch. The source terminal of the low side switch 16 is coupled to the low voltage node 18, the drain of the low side switch 16 is electrically coupled to the source of the high side switch 15 at node 19. The drain of the high side switch 15 is electrically coupled to the high voltage node 17. The gate of the low side switch 16 is coupled to a gate driver at node 21 and the gate of the high side switch 15 is coupled to a gate driver at the node 22.

Each pair 11, 12, 13, 14 of switches may include two bypass capacitors 23, 24 which are coupled in parallel with one another and between the source of the low side switch 16 and, therefore, the low voltage node 18 and the drain of the high side switch 15 and, therefore, the high voltage node 17. Each of the further pairs 12, 13, 14 of switches has the same structure. Consequently, the half-bridge circuit 10 includes four high side switches Q1, Q3, Q5, Q7 and four low side switches Q2, Q4, Q6, Q8 coupled in parallel between the high voltage node 17 and the low voltage node 18 and having an output node 19 coupled to a common output node 20.

In the half-bridge circuit 10 illustrated in FIG. 1, eight switches Q1 to Q8 are provided. However, the half-bridge circuit 10 may include fewer than eight switches coupled in parallel or more than eight switches coupled in parallel depending on the current rating of each of the switches and the desired current carrying capability of the half-bridge circuit.

According to embodiments of the invention, a circuit arrangement is provided in which the physical arrangement of two or more pairs of switches coupled in parallel to form a half-bridge circuit is designed so as to equalise the current carrying capability of each of the pairs of switches.

If, for example, the switches are physically arranged in a pattern replicating the circuit diagram of FIG. 1, the high voltage node and the low voltage node are formed by a conductive bus having a connector is coupled at one end, for example adjacent the pair 11, the pairs 12, 13, 14 are arranged at increasing distance from the connector. This can lead to non-uniform or unequal current sharing between the pairs 11, 12, 13, 14 of switches such that the current switching capability of the half-bridge circuit is less than that theoretically possible by connecting four pairs of switches in parallel between the high voltage node and the low voltage node.

According to embodiments of the invention, a circuit arrangement is provided in which the physical arrangement of the switches Q1 to Q8 provides a more uniform distribution of current between the pairs of switches and assists in equalising current sharing between the pairs of switches. In some embodiments, this may be achieved by providing a single output connector and by equalising the physical distance between the output nodes of the pairs of switches and the output connector. Further equalisation of the current distribution or sharing between the pairs may be achieved by equalising the physical distance between the high side switch and the high voltage connectors coupled to the high voltage node and by equalling the physical distance between the low side switch and the low voltage connectors coupled to the low voltage node.

Figure 2:
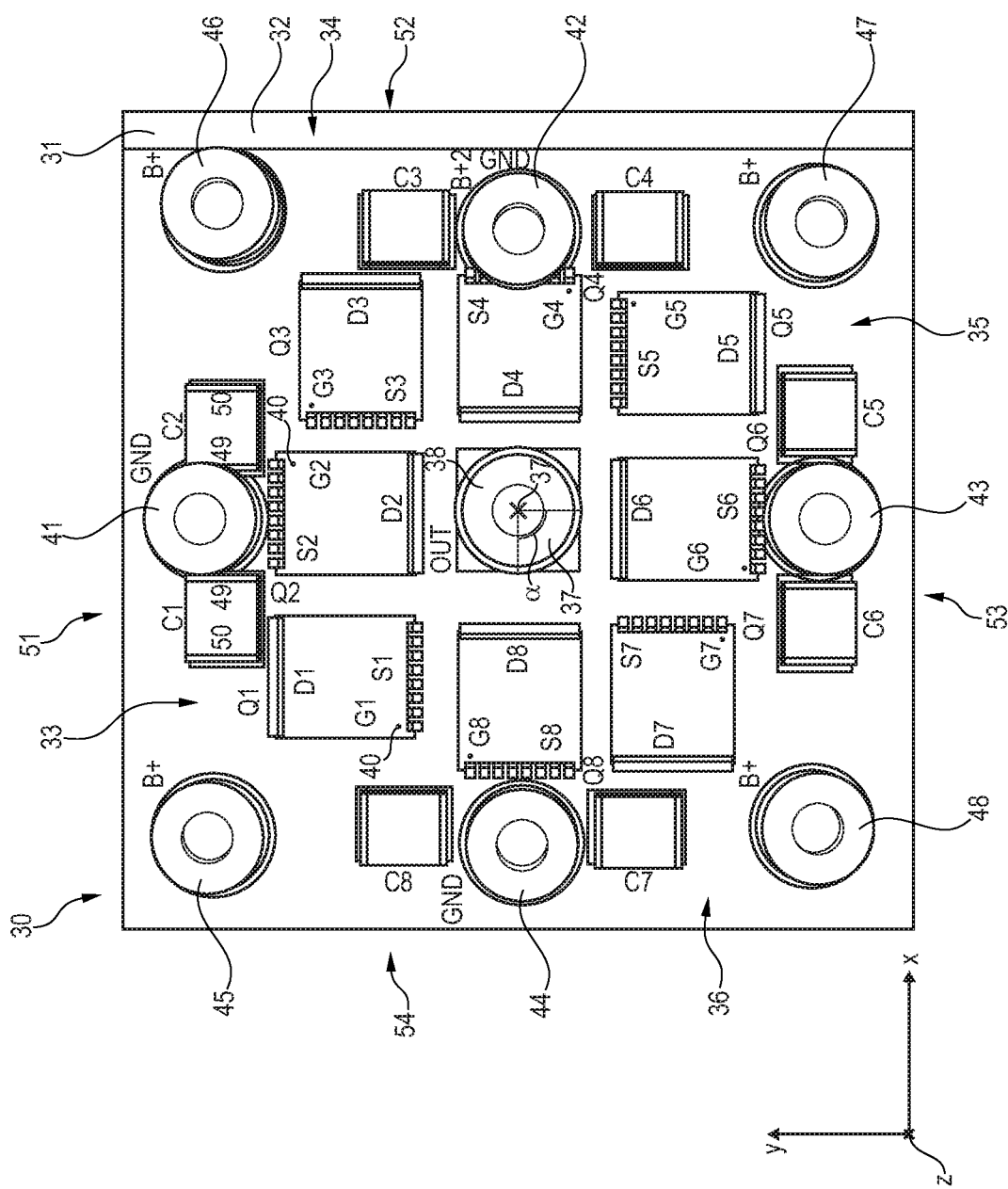
FIG. 2 illustrates a plan view of a circuit arrangement for a half-bridge circuit including multiple transistor devices coupled in parallel.

FIG. 2 illustrates a plan view of a circuit arrangement 30 including eight switches Q1 to Q8 arranged on a surface 31 of a substrate 32 which are electrically coupled to provide a half-bridge circuit including four pairs 33, 34, 35, 36 of serially coupled switches, each pair 33, 34, 35, 36 being coupled in parallel between a high voltage node and a low voltage node. The pairs 33, 34, 35, 36 may correspond to the pairs 11, 12, 13, 14 of the circuit diagram illustrated in FIG. 1. Similarly, the switches Q1 to Q8 may correspond to the switches Q1 to Q8 of the circuit diagram illustrated in FIG. 1. The pair of switches or half-bridge assembly 33 includes the switches Q1 and Q2, the pair of switches or half-bridge assembly 34 includes the switches Q3 and Q4, the pair of switches or half-bridge assembly 35 includes the switches Q5 and Q6, the pair of switches or half-bridge assembly 36 includes the switches Q7 and Q8.

Each pair 33, 34, 35, 36 of switches includes a node coupled to an output node 37 provided by an output connector 38 arranged on the surface 31 of the substrate 32. The output connector 38 is arranged towards the lateral centre of the substrate 32 and includes an axis 39 which extends substantially perpendicular to the major surface 31 of the substrate 32. Using the Cartesian coordinate system, the substrate 32 and plane of the drawing can be described as lying in the xy plane with the axis 39 extending in the z direction and perpendicular to the substrate 32 and plane of the drawing as indicated in FIG. 2.

In some embodiments, such as that illustrated in FIG. 2, the pairs 33, 34, 35, 36 of switches Q1 to Q8 are distributed around the axis 39 of the output connector 38 such that the pairs 33, 34, 35, 36 of switches Q1 to Q8 are arranged laterally adjacent all sides of the output connector 38. The pairs 33, 34, 35, 36 of switches Q1 to Q8 can be considered to be uniformly distributed around the axis 39 of the output connector 38.

The output connector 38 is arranged centrally on the major surface 31 of the substrate 32 and the switches Q1 to Q8 are arranged laterally adjacent the output connector 38 such that the output connector 38 is laterally surrounded by the switches Q1 to Q8. In some embodiments, the switches Q1 to Q8 may have a substantially circular or ring-type arrangement around the output connector 38. The density of switches Q1 to Q8 in each quadrant of the substrate 32 having a centre point vertically aligned with the axis 39 of the output connector 38 is as equal as possible and may be substantially the same as the distribution of the switches around the axis 39 of the output connector 38 is uniform or homogeneous. For example each quadrant of the substrate 32 illustrated in FIG. 2 includes an area occupied by switches that corresponds to the area of two switches. These physical arrangements of the switches and pairs of switches with respect to the single common output connector promotes equalised current sharing between the pairs of switches.

In some non-illustrated embodiments, the pairs of switches may be arranged laterally adjacent all sides of the output connector such that the shortest line of sight between a predetermined point of each of the pairs of switches and the output connector and/or between a predetermined point of each of the pairs of switches and the axis of the output connector is as similar as possible and may be substantially the same. This physical arrangement also promotes equalised current sharing between the pairs of switches. The predetermined point may be the drain of the low side switch, the lateral centre of the area occupied by the pair of switches, or the centre of the shortest line of sight between the drain of the low side switch and the source of the high side switch, for example.

Each switch Q1 to Q8 includes a source S, a drain D and a gate G, for example the switch Q1 includes a source S1, a drain D1 and a gate G1, the switch Q2 includes a source S2, a drain D2 and a gate G2. In the embodiment illustrated in FIG. 2, each of the switches Q1 to Q8 comprises a transistor device, for example a MOSFET device, having a drain terminal D, a source terminal S and a gate terminal G, whereby the drain terminal D is arranged on a first lateral side of the transistor device and the source terminal S and gate terminal G are arranged on an opposing lateral side of the transistor device. The transistor device may be a packaged transistor device in which a semiconductor die including the transistor device is accommodated within a package, or the transistor device may be a bare transistor device die.

The pair 33 includes the switches Q1 and Q2, whereby Q1 is the high side switch and Q2 the low side switch of the pair of half-bridge assembly. The drain terminal D2 of the transistor device Q2, which forms the low side switch of the pair 33, faces towards the output connector 38 and the source terminal S2 and gate terminal G2 of the transistor device Q2 face away from the output connector 38. The switch Q1 providing the high side switch of the pair 33 is arranged laterally adjacent the switch Q2 providing the low side switch of the pair 33, in the x direction, and is aligned with the switch Q2 such that the drain terminal D1 is laterally aligned in the x direction with the source terminal S2 and gate terminal G2 of the low side switch Q2 and such that the source terminal S1 and gate terminal G1 of the high side switch Q1 are laterally arranged aligned in the x direction with the drain terminal D2 of the low side switch Q2.

The low side switch Q2 of pair 33 is, in the plan view of FIG. 2, arranged above the output connector 38 in the y direction. The high side switch Q1 of the pair 33 is arranged above and to the left of the output connector 38.

The switches Q1, Q2 each include at least one indicator 40 from which the orientation of the switch is discernible. For example, each switch Q1, Q2 may include an indicator in the form of a dot or other mark indicating the position of the gate terminal G. The switches Q1, Q2 of the pair 33 face in opposing lateral directions as, for example, the gate terminal G2 faces upwards and the gate terminal G1 faces downwards in the view illustrated in FIG. 2.

The switches of each pair 33, 34, 35, 36, for example the switches Q3 and Q4 of pair 34, have within the pair, the same physical arrangement of the transistor devices and their terminals as that of the pair 33. The pair 34 of switches Q3, Q4, whereby Q3 forms the low side switch and Q4 the high side switch, is arranged on the surface 31 of the substrate 32 with respect to the output connector 38 such that the drain D4 of the low side switch Q4 is arranged adjacent the output connector 38 and horizontally to the right of the output connector 38 in the x direction. The high side switch Q3 of the pair 34 is arranged laterally adjacent in the x direction from the low side switch Q2 of the pair 33 and above and to the right of the output connector 38. The drain D4 of the low side switch Q4 and the source S3 and gate G3 of the high side switch Q3 of the pair 34 are laterally aligned in the y direction.

The pair 34 can be considered to be rotated through an angle of 90° from the pair 33. Consequently, the drain terminals D2, D4 of the switches Q2, Q4 are arranged substantially perpendicular to one another in the x direction and y direction respectively.

Similarly, the pair 35 of switches Q5 and Q6, whereby Q6 forms the low side switch and Q5 the high side switch, are arranged on the surface 31 on the substrate 32 such that the drain D6 of the low side switch Q6 faces towards the output connector 38 and such that the switch Q6 is aligned with the output connector 38 and the switch Q2 in the y direction. The switch Q5 is arranged below and to the right of the output connector 38 and faces towards the switch Q4. The drain D6 of the low side switch Q6 and the source S5 and gate G5 of the high side switch Q5 of the pair 35 are laterally aligned in the x direction. The pair 35 of switches Q5, Q6 can be considered to be rotated by an angle of 90° from the pair 34. Consequently, the drain terminals D4, D6 of the switches Q4, Q6 are arranged substantially perpendicular to one another in the y direction and x direction, respectively.

Similarly, the pair 36 of switches Q7, Q8 is arranged on the substrate 31 of the substrate 32 such that the drain D8 of the low side switch Q8 faces towards the output connector 38 and is horizontally aligned and positioned to the left of the output connector 38 in the y direction. The source S7 of the switch Q7 faces towards the switch Q6. The drain D8 of the low side switch Q8 and the source S7 and gate G7 of the high side switch Q7 of the pair 36 are laterally aligned in the y direction. The pair 36 of switches Q7, Q8 can be considered to be rotated by an angle of 90° from the pair 35. Consequently, the drain terminals D6, D8 of the switches Q6, Q8 are arranged substantially perpendicular to one another in the x direction and y direction, respectively. The pair 36 of switches Q7, Q8 can be considered to be rotated by an angle of 90° from the pair 33. Consequently, the drain terminals D8, D2 of the switches Q8, Q2 are arranged substantially perpendicular to one another.

The high side switches Q1, Q3, Q5, Q7 of the half-bridge circuit 31 are arranged alternately with the low side switches Q2, Q4, Q6, Q8 of the half-bridge circuit 31 in a substantially circular or ring-shaped direction about the output connector 38.

The circuit arrangement 30 also includes four low voltage connectors 41, 42, 43, 44 which are coupled to the low voltage node of the half-bridge circuit. In this embodiment, the low voltage connectors 41, 42, 43, 44 are ground connectors and are laterally aligned to the top, bottom, left and right of the output connector 38 in the plan view of FIG. 2. The low voltage connector 41 is arranged adjacent to and aligned with the source terminal S2 of the switch Q2. The low voltage connector 42 is arranged adjacent and aligned with the source terminal S4 of the switch Q4, the low voltage connector 43 is arranged adjacent and aligned with the source terminal S6 of switch Q6 and the high voltage connector 44 is arranged adjacent and aligned with the source terminal S8 of the switch Q8. The low voltage connectors 41 and 43 are laterally aligned in the y direction and the low voltage connectors 42 and 44 are laterally aligned in the x direction.

The circuit arrangement 30 also includes four high voltage connectors 45, 46, 47, 48 which are coupled to the high voltage node of the half-bridge circuit. The high voltage connectors 45, 46, 47, 48 are arranged in each of the four corners of the surface 31 of the substrate 32. In the plan view of FIG. 2, the high voltage connector 45 is diagonally aligned with, i.e. is arranged above and to the left of, the drain terminal D1 of the switch Q1, the high voltage connector 46 is diagonally aligned with, i.e. is arranged above and to the right of, the drain terminal D3 of the switch Q3, the high voltage connector 47 is diagonally aligned with, i.e. is arranged below and to the right of, the drain terminal D5 of the switch Q5 and the high voltage connector 48 is diagonally aligned with, i.e. is arranged below and to the left of, the drain terminal D7 of the switch Q7. The high voltage connectors 45, 46, 47, 48, the low voltage connectors 41, 42, 43, 44 and the output connector 38 can be considered to be arranged in a grid.

The switches Q1 to Q8 of each pair 33, 34, 35, 36 are coupled in series and the pairs 33, 34, 35, 36 are coupled in parallel between a high voltage node and low voltage node to form the circuit illustrated in FIG. 1. However, the physical arrangement of the switches Q1 to Q8 does not replicate the physical arrangement of the circuit features as illustrated in FIG. 1.

The physical arrangement of the switches Q1 to Q8 in relation to the common output connector 38 enables the current carrying capacity of the half-bridge circuit to be more uniformly distributed between the pairs 33, 34, 35, 36 of switches since the physical distance between the pairs 33, 34, 35, 36 and the output connector 38 is as similar as possible. Additionally, the physical distance between the drain terminals D1, D3, D5, D7 of the high side switches Q1, Q3, Q5, Q7 and the high voltage connectors 45, 46, 47, 48 is a similar as possible and the physical distance between the source terminals S2, S4, S6, S8 of the low side switches Q2, Q4, Q6, Q8 and the low voltage connectors 41, 42, 43, 44 is a similar as possible.

Each pair 33, 34, 35, 36 of switches is rotated about the axis 39 from its immediate neighbour by an angle $\alpha$, where $\alpha=360°/n$, where n is the number of pairs. In the embodiment illustrated in FIG. 2, n is 4 so that $\alpha$ is around 90°. In practice, deviations from the ideal angle $\alpha$ may occur due to practical placement constraints. Therefore, the angle $\alpha$ includes deviations from the value of 360°/n. The angle $\alpha$ may include a deviation range of $360°/n \pm 5°$, for example.

For other numbers of switches in the half-bridge circuit, the circuit arrangement may also obey the layout rule that each pair 33, 34, 35, 36 of switches is rotated about the axis 39 from its immediate neighbour by an angle $\alpha$, where $\alpha=360°/n$, where n is the number of pairs, n being a natural number equal or greater than 2. n high side switches and n low side switches are, therefore, provided for the n pairs and may be arranged alternately such that each high side switch is rotated about the axis 39 from the next high side switch by 360°/n and each low side switch is rotated about the axis 39 from the next low side switch by 360°/n.

As is illustrated in FIG. 1, the half-bridge circuit 30 may also include bypass capacitors C1 to C8. In some embodiments, two bypass capacitors are associated with each pair of switches, for example the capacitors C1 and C2 are associated with the pair 11 of switches Q1 and Q2 in FIG. 1 and pair 33 of switches Q1 and Q2 in FIG. 2. The bypass capacitors C1, C2 are coupled in parallel with one another and between the low voltage node 18 and the high voltage node 17.

The bypass capacitors C1 to C8 may also be arranged on the surface 31 of the substrate 32 such that they have a uniform distribution around the axis 39 of the output connector 38. As can be seen in the top view of the circuit arrangement in FIG. 2, the bypass capacitors C1 to C8 are arranged in pairs 51, 52, 53, 54, the capacitors of each pair being arranged on opposing sides of one of the low voltage connectors 41, 42, 43, 44 such that a first terminal 49 of the each of the capacitors, e.g. capacitor C1, faces towards the low voltage connector, e.g. low voltage connector 41, and a second terminal 50 of each of the capacitors, e.g. the second terminal 50 of capacitor C1 faces towards a high voltage connector, e.g. high voltage connector 45.

The pairs 51, 52, 53, 54 of capacitors C1 to C8 are arranged at a similar distances from the axis 39 of the output connector 38. In some embodiments, the shortest line of sight between a predetermined point of the pairs 52, 52, 53, 54 of capacitors Q1 to Q8 from the axis 39 of the output connector 38 is as similar as possible or substantially the same. Each pair 51, 52, 53, 54 of capacitors is rotated from the neighbouring pair, e.g. pair 52 from pair 52 and pair 53 from pair 52, by an angle 360°/n, where n is the number of pairs of switches and the number of pairs of bypass capacitors.

Figure 3:
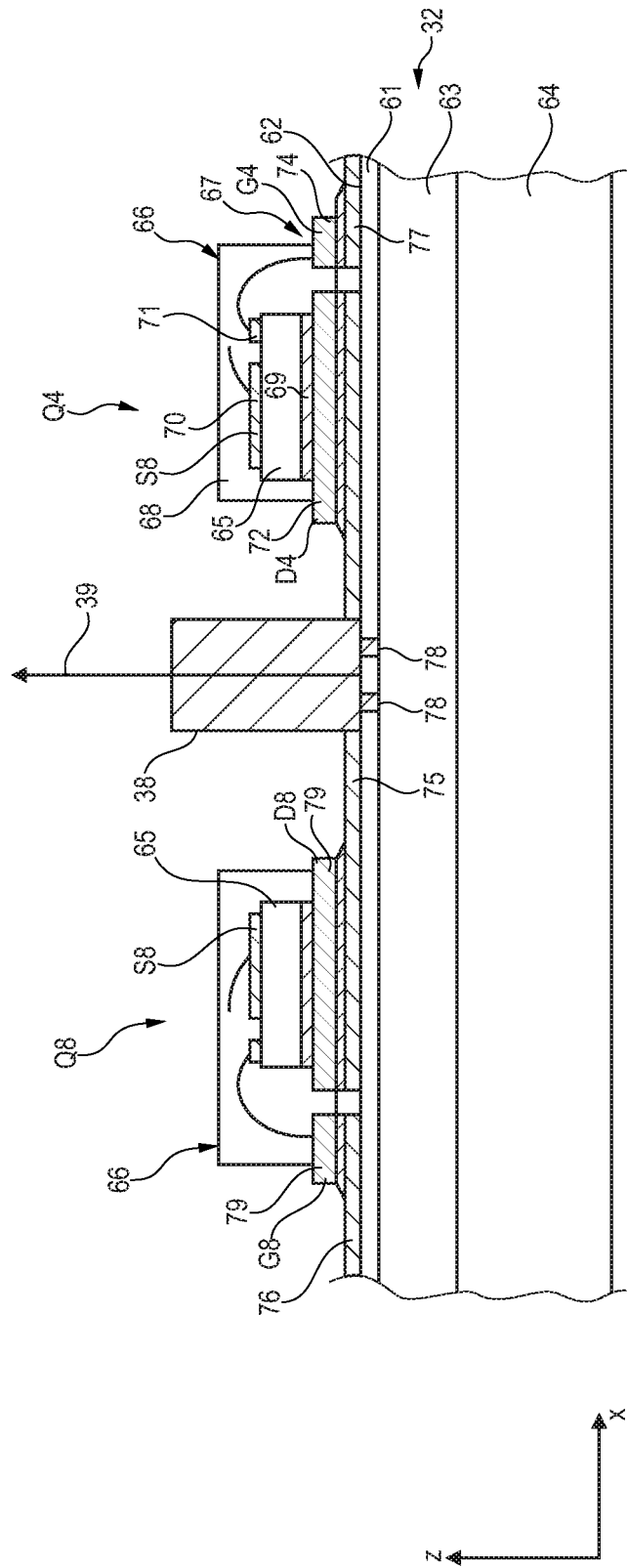
FIG. 3 illustrates a cross-sectional view of a portion of the circuit arrangement for providing a half-bridge including multiple transistor devices coupled in parallel.
Figure 4:
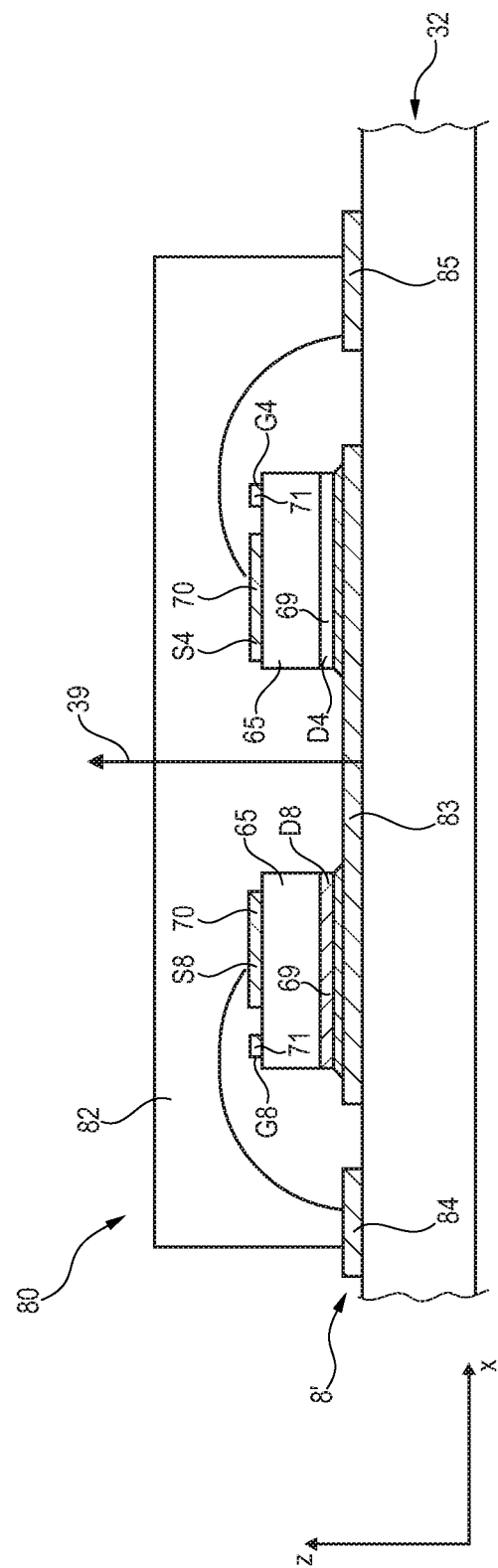
FIG. 4 illustrates a cross-sectional view of a module for providing a half-bridge circuit including multiple transistor devices coupled in parallel.

FIGS. 3 and 4 illustrate cross-sectional views of a portion of the substrate 32 in which two switches, in particular the low side switches Q4 and Q8 of FIG. 2, and the output connector 38 are depicted. Using the Cartesian coordinate system shown in FIG. 2, the cross-sectional views of FIGS. 3 and 4 each illustrate a view of the substrate 32 in the xz plane in which the axis 39 of the output connector 38 extends in the z direction. As discussed above, the switches Q1 to Q8 may be provided by packaged transistor devices, as illustrated in FIG. 3, or as bare transistor device dies, as illustrated in FIG. 4.

The substrate 32 supporting the circuit arrangement 30 that provides the half-bridge circuit may have different forms. In some embodiments, such as that illustrated in FIG. 3, the substrate 32 may be an insulated metal substrate (IMS) which includes an insulating dielectric layer 61 which supports a conductive layer 62. The conductive layer 62 may include a metal, such as copper, and may be structured or patterned to provide the electrical connections between the switches Q1 to Q8, the low voltage connectors 41, 42, 43, 44, the high voltage connectors 45, 46, 47, 48 and the output connector 38 to form the half-bridge circuit. The insulation layer 61 may in turn be supported on a metal support substrate 63. The support substrate 63 may include aluminium, for example. The substrate 32 may be mounted on a heatsink 64, for example.

In other embodiments, the substrate 32 may include a circuit board, such as a printed circuit board, which includes a fibre reinforced core and one or more conductive redistribution layers positioned on one or more sides of the core. In some embodiments, the substrate may include two or more conductive redistribution layers on the major surfaces of the substrate and one or more vias extending perpendicularly to the major surface of the substrate depending on the complexity of the conductive redistribution structure.

In some embodiments, the switches, for example the switches Q4 and Q8 which can be seen in the cross-sectional view of FIG. 3, may include a transistor device 65 accommodated in a package 66. The transistor device 65 may be a vertical transistor device with terminals on opposing surfaces, such as a vertical MOSFET device. The package 66 may include a package substrate 67 which may have the form of a lead frame, for example a copper lead frame, and a housing 68 which may be provided by a plastic, such as an epoxy resin.

The transistor device 65 may include a first current terminal 69 arranged on the lower surface and a second current terminal 70 and a control terminal 71 arranged on the upper surface. In the case of a MOSFET device, the first current is a source terminal and the control terminal 71 is a gate terminal. The drain terminal 69 on the lower surface of the transistor device 65 may be mounted on and electrically connected to a portion 72 of the lead frame 67 providing a die pad. The source terminal 70 may be electrically coupled to a further portion 73 of the lead frame and the gate terminal 71 to a further portion 74 of the lead frame 67. The further portions 73, 74 of the leadframe 67 are spaced apart and electrically insulated from one another and from the die pad 72 by the plastic housing 68. Portions of the lead frame 67, for example the lower surface, are exposed from the housing 68 and provide outer contacts or pins 79. The outer contacts are mounted on portions of the conductive layer 62 of the substrate 32 using solder, for example.

As is illustrated in the cross-sectional view of FIG. 3, the drain terminal 69 of each of the switches Q4, Q8 is electrically connected to the output connector 38 by way of a conductive trace 75 of the conductive layer 62 of the substrate 32 on which the die pad 72 of the package 66 is mounted. The further outer contacts or pins of the packages 66 are mounted on further traces, such as traces 76, 77 of the conductive layer 62. The conductive traces 75, 76, 77 are electrically insulated from one another by intervening portions of the insulating layer 61 on which the conductive layer 62 is positioned.

In other embodiments, the switches Q1 to Q8 may have the form of a bare die, in particular a bare transistor device die, such as the transistor device die 65. FIG. 4 illustrates an example of such an arrangement in which a module 80 includes eight bare transistor die having an arrangement corresponding to that illustrated in FIG. 2. The module 80 provides a half-bridge circuit as illustrated in FIG. 1. The module 80 is not limited to including eight switches, but may also include less than eight or more than eight switches.

The various transistor device dies 65 providing the switches Q1 to Q8 may be mounted on a conductive redistribution structure 81 of the substrate 32. The substrate 32 forms a part of the module 80 in this embodiment. The redistribution structure 81 may include a first trace on which the drain D4 and the drain D5 of the transistor device dies 65 of the switches Q4, Q8 are mounted and electrically connected. The source S8 of the switch Q8 may be coupled to a conductive trace 84 and the source S4 of the switch Q4 may be coupled t conductive trance 85 of the redistribution structure 81. The gates G4, G8 are also coupled to further traces of the redistribution structure 81 that cannot be seen in the cross-sectional view of FIG. 4.

The transistor device dies 65 may be embedded within a common plastic housing 82 such that a module 80 is formed providing half-bridge circuit with multiple switches Q1 to Q8 coupled in parallel between the low voltage node and high voltage node, each pair of switches having an output node coupled to a common output connector that is coupled to the conductive trace 83.

Figure 5:
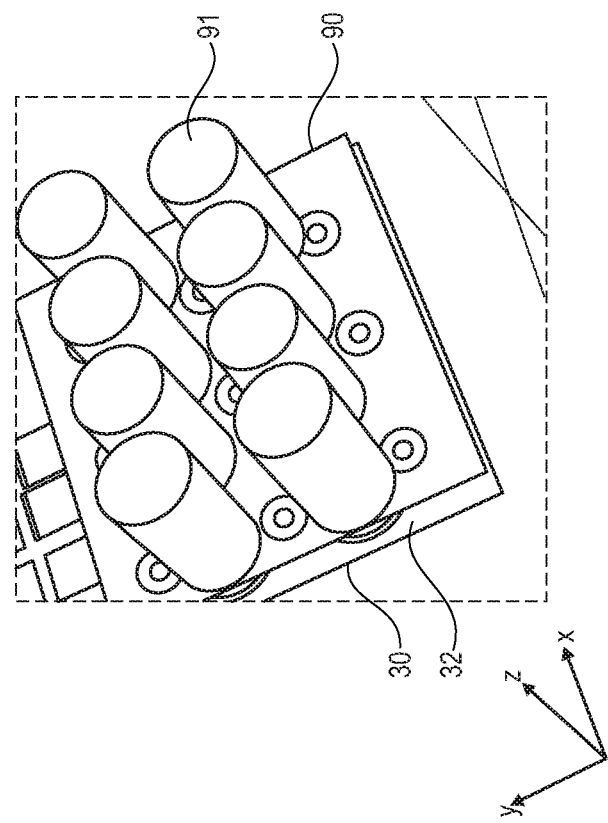
FIG. 5 illustrates a perspective view of a structure including a redistribution board having the circuit arrangement.

FIG. 5 illustrates a perspective view of a further substrate 90 arranged above the substrate 32. The substrate 32 including the switches Q1 to Q8 providing the half-bridge circuit may be coupled together with further elements providing one or more further portions of a circuit. The further substrate 90 may include capacitors 91.

In an embodiment, the half-bridge circuit having a circuit arrangement as illustrated in FIGS. 2 to 4 may be coupled to gate driver circuitry for driving the gates of the transistor devices. The gate driver circuitry and components for driving the gates, such as one or more gate driver chips, may be mounted on a further substrate forming a driver substrate which is stacked on or above the substrate 32 on which the switches Q1 to Q8 are mounted. For example, in embodiments in which the switches Q1 to Q8 are provided by packaged semiconductor devices 66 including pins 79, the gate driver or drivers may be mounted on a driver substrate including connectors which are mounted on and electrically connected to the gate pins of the switches Q1 to Q8.

The output connector 38, the low voltage connectors 41, 42, 43, 44 and the high voltage connectors 45, 46, 47, 48 may have the form of poles extending upwards from the first major surface 31 of the substrate 32 in the z direction. One or more further substrates 90 may be mounted on these poles, as illustrated in FIG. 5.

In an embodiment, two further substrates are stacked onto the substrate 32. For example, a first further substrate 90 may include capacitors 91 and form a capacitor substrate and a second further substrate may include gate drivers and form a driver substrate. The further substrates may be stacked on the same side or opposing sides of the substrate 32.

Figure 6:
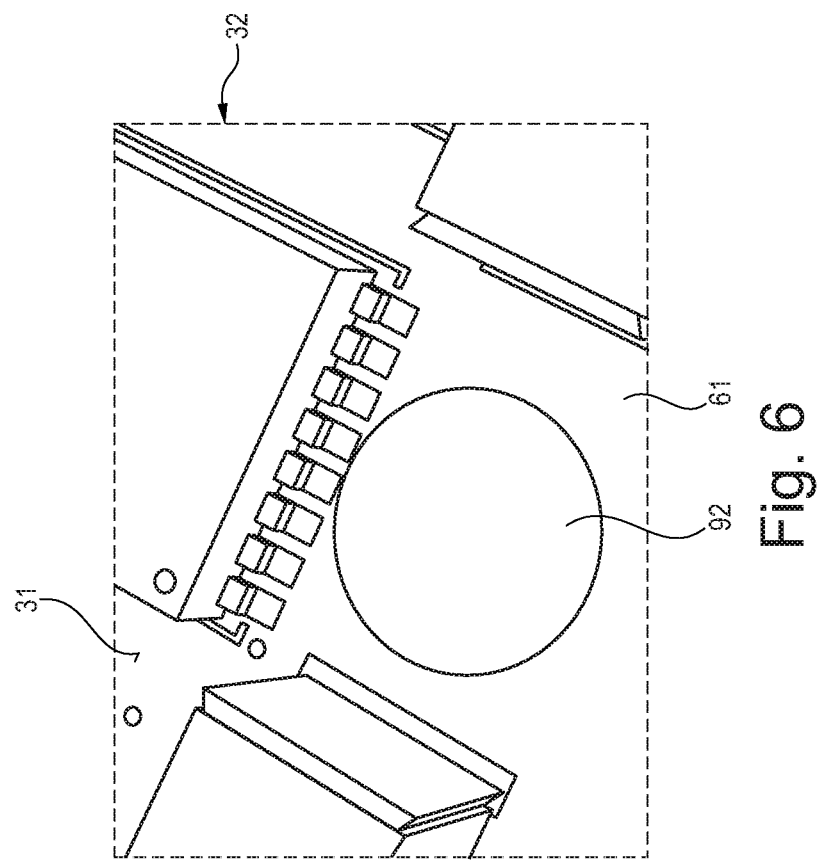
FIG. 6 illustrates a perspective view of a portion of a low voltage connector which may be used in the circuit arrangement.

FIG. 6 illustrates a perspective view of a portion of a low voltage connection on the substrate 32.

In some embodiments, the low voltage node 18 may be a ground node. The connections from the low voltage connectors 41, 42, 43, 44 to the ground plane may be coupled to a ground plane which may also serve as a ground for other components. In some embodiments, such as that illustrated in FIG. 6, the low voltage connectors 41, 42, 43, 33, not illustrated in FIG. 6, may each include a conductive trace or contact pad 92 on the surface 31 of the substrate 32. One or more through contacts or vias may be provided that extend from the conductive trace 92 through the thickness of the dielectric layer 61 of the substrate 32 to an underlying conductive layer which serves as the ground plane. For example, in embodiments including an insulated metal substrate, such as that illustrated in FIG. 3, the support substrate 63 may act as a ground plane so that the vias 78 extend through the insulating layer 61 and are electrically connected to the support substrate 63. The low voltage connectors 41, 42, 43, 44 may have the form of a pole or protrusion which is mounted on, and electrically coupled to, the one or more through contacts 78. One or more of the low voltage connectors 41, 42, 43, 44 may provide a ground connection for one or more further substrates 90 stacked on top of the substrate 32 and for one or more devices supported on the further substrate 90.

As discussed above, the half-bridge circuit is not restricted to including four pairs of switches or half-bridge assemblies coupled in parallel between a high voltage node and a low voltage node and a total of eight switches. The half-bridge circuit may include other numbers of pairs of switches or half-bridge assemblies which may be mounted on the substrate according to the principles outlined above.

Figure 7A:
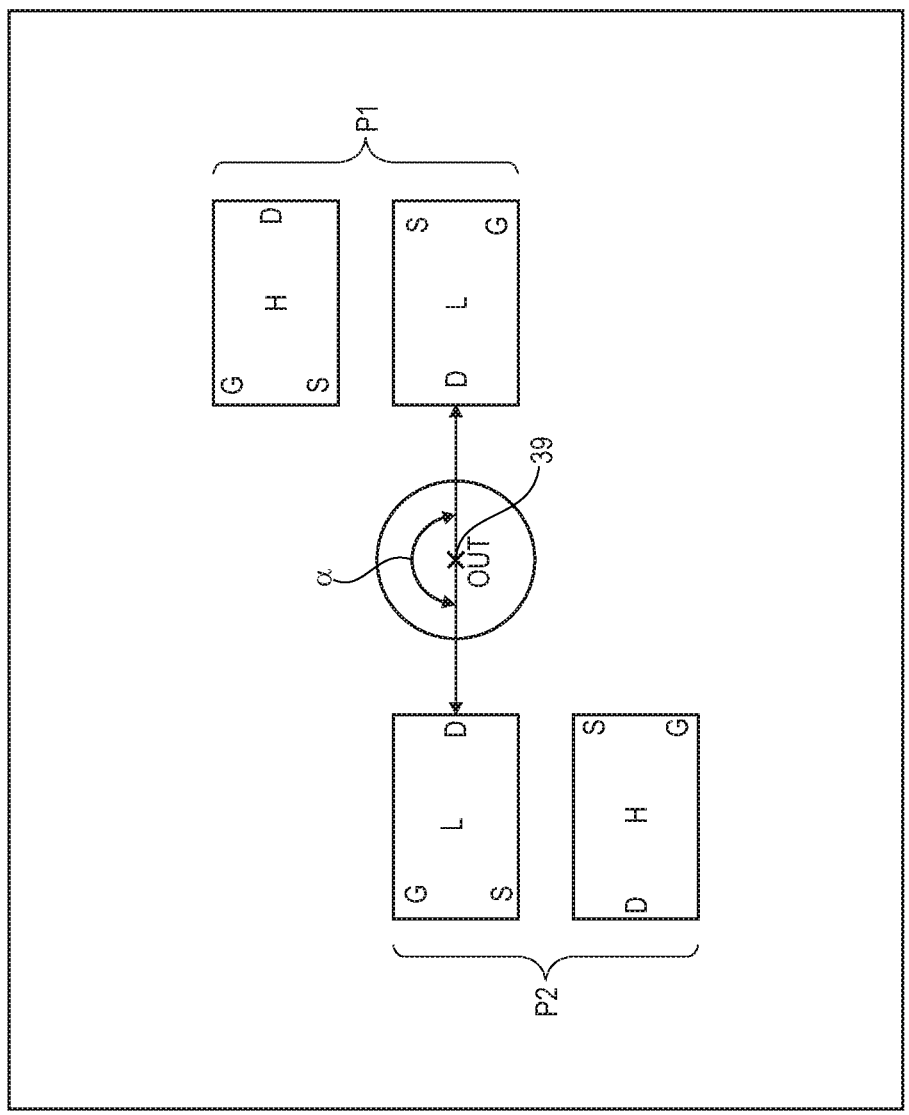
FIG. 7a illustrates a schematic plan view of a circuit arrangement including two pairs of transistor devices coupled in parallel.
Figure 7B:
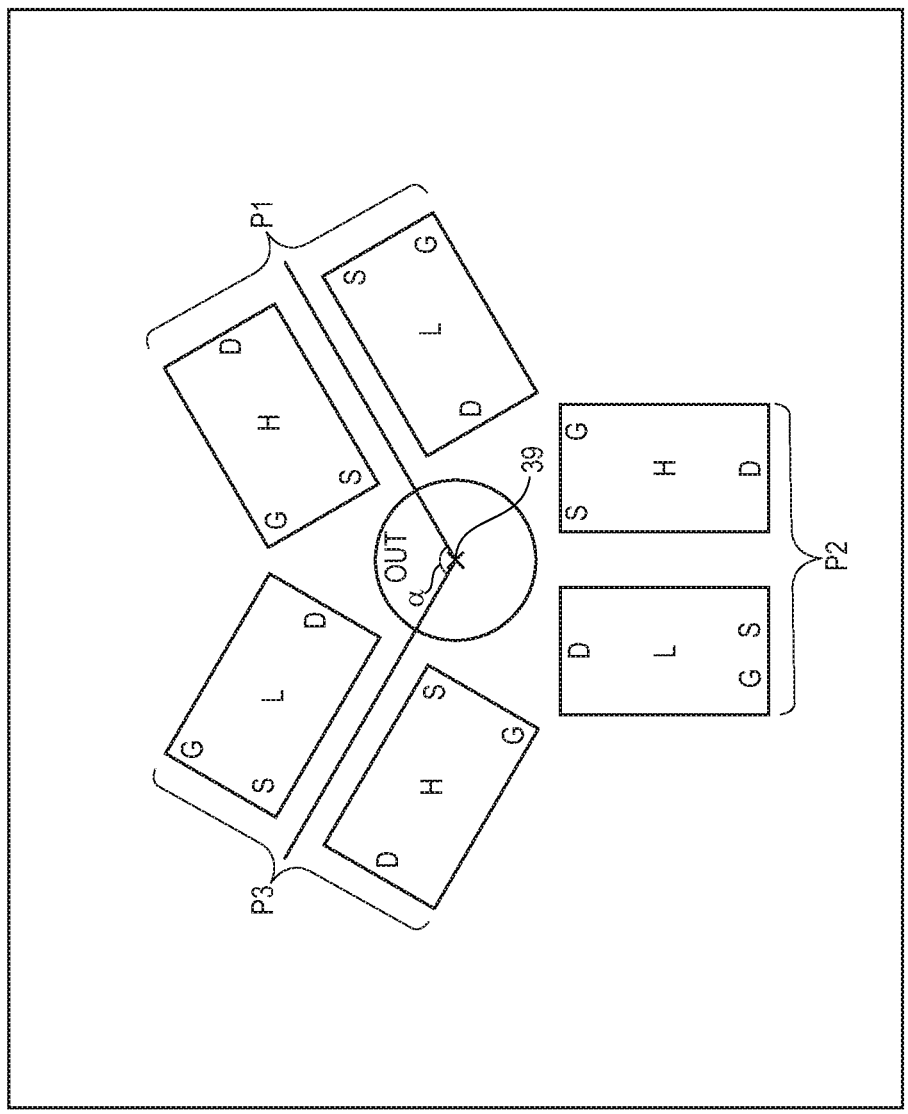
FIG. 7b illustrates a plan view of a circuit arrangement including three pairs of transistor devices coupled in parallel.
Figure 7C:
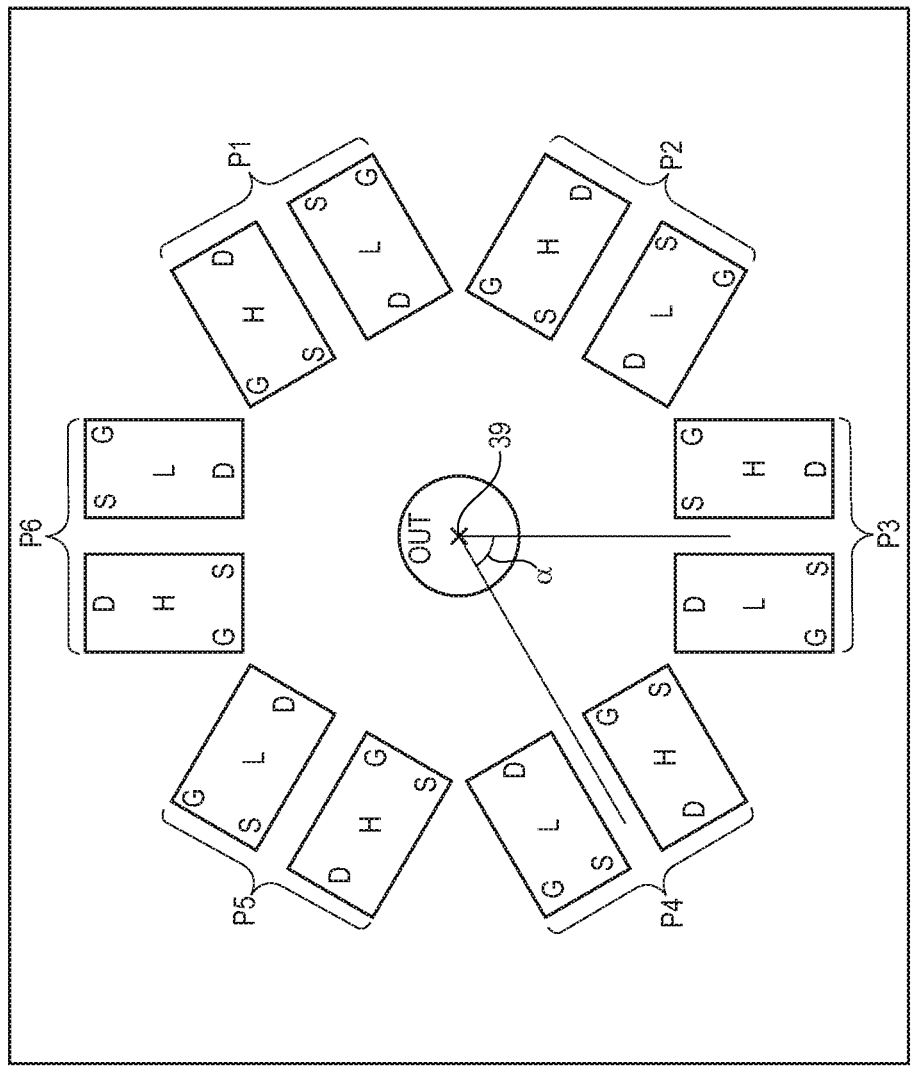
FIG. 7c illustrates a plan view of a circuit arrangement including six pairs of transistor devices coupled in parallel.

FIGS. 7a-7c illustrate respective schematic plan views of three circuit arrangements which include pairs of switches, whereby the two switches of the pair are coupled in series. Each pair includes a high side switch H and a low side switch L coupled in series. Using the Cartesian coordinate system, the plane of the drawing can be considered to be the xy plane and the axis 39 of the output can be considered to extend in the z direction and perpendicular to the xy plane and the plane of the drawing.

FIG. 7a illustrates a circuit arrangement with two pairs of switches and, therefore, four switches in FIG. 7a, three pairs and, therefore, six switches in FIG. 7b and six pairs and, therefore, 12 switches in FIG. 7c. In each of the circuit arrangements, the pairs of switches are laterally uniformly distributed about a common output connector. Furthermore, the shortest line of sight between each of the high side switches H of the pairs and the output connector OUT is similar as possible and the shortest line of sight between the low side switches L of pairs and the output connector OUT is as similar as possible. Adjacent ones of the pairs may form a reorientation angle α of around 360°/n where n is the number of pairs about the axis 39 of the output connector OUT, the axis 39 extending in the z direction and perpendicular to the xy plane in which the pairs are located.

As is illustrated in the plan view of FIG. 7a, for an embodiment including two pairs of switches P1, P2, the angle of reorientation α is 360°/2 or around 180° between the pairs. As is illustrated in the plan view of FIG. 7b for an embodiment including three pairs of switches, the angle of reorientation α is 360°/3 or around 120° between adjacent pairs, e.g. between pairs P3 and P1. As can be seen from the plan view of FIG. 7c for an embodiment including six pairs of switches, the angle of reorientation α between adjacent pairs is 360°/6 and therefore around 60°, e.g. between pairs P3 and P4.

The high side switches H and the low side switches L are arranged about the output connector OUT alternately, such that the low side switch L of one pair is arranged between a high side switch H of its pair and high side switch H of another pair.

Figure 8:
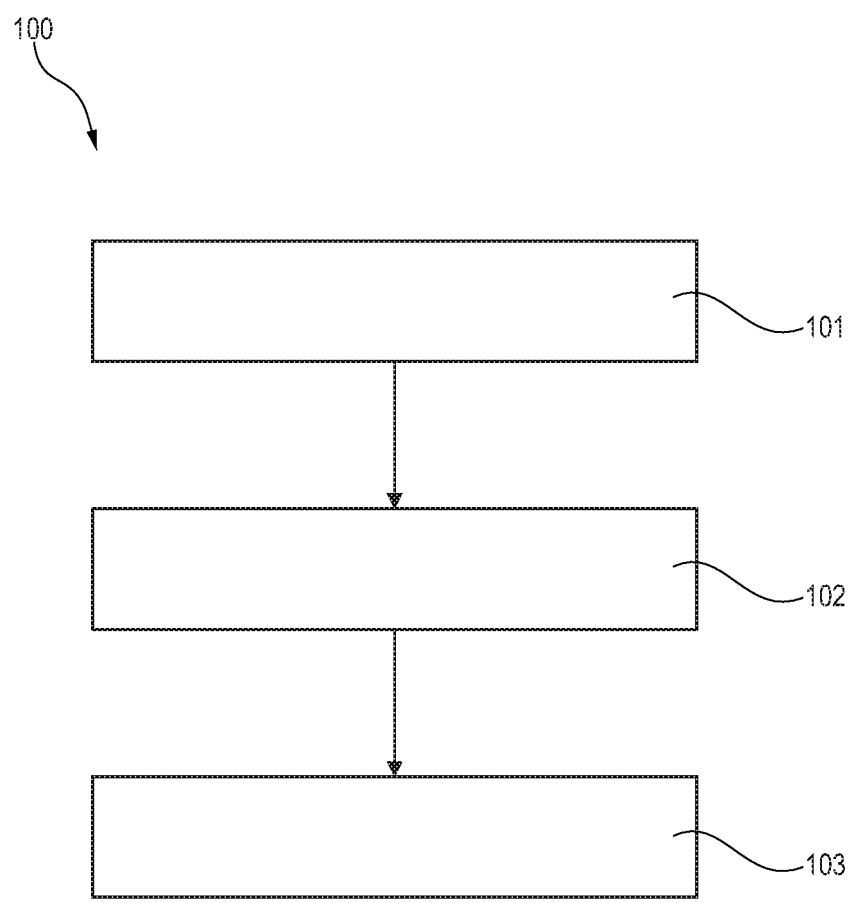
FIG. 8 illustrates a flow chart of a method for fabricating a half-bridge circuit.

FIG. 8 illustrates a flow diagram 100 of a method of fabricating a half-bridge circuit.

In box 101, an output connector is provided on a substrate. The output connector provides an output node of the half-bridge circuit and has an axis that is substantially perpendicular to a major surface of the substrate. In box 102, n high side switches are arranged on the substrate such that the angle formed between adjacent ones of the high side switches with respect to the axis is 360°/n, where n is a natural number which is equal or greater than 2. In box 103, n low side switches are arranged on the substrate such that the angle formed between adjacent ones of the low side switches with respect to the axis is 360°/n. Additionally, the low side switches and the high side switches are arranged alternately around the axis of the output connector.

The high side switches and low side switches are arranged on the same surface of the substrate and are arranged laterally uniformly about the output connector since the angle of reorientation between a predetermined point on neighbouring low side switches is α, where α=360°/n and since the angle of reorientation between a predetermined point between neighbouring high side switches is 360°/n. The predetermined point, may be, for example, an edge, a corner of the housing, a pin, etc.

In some embodiments, the n high side switches are arranged on the first surface of the substrate so that a shortest line of sight between each of the high side switches and the output connector and/or axis is as similar as possible and in some embodiments substantially the same. The low side switches are also arranged on the first surface of the substrate such that a shortest line of sight between each of the low side switches and output connector and/or axis is similar as possible and, in some embodiments, is substantially the same.

The high side switches and the low side switches may each comprise an indicator which indicates a lateral orientation of the respective switch. The method may further include arranging neighbouring ones of the high side switches and the low side switches in opposing lateral directions. The high side switch and low side switch coupled in series to provide a pair may also be arranged on the surface of the substrate with opposing lateral directions. In this case, the indicator of a neighbouring high side switch and low side switch forming a pair face in opposing lateral directions. This embodiment may be useful if, for example, the source terminal and the drain terminal are arranged on opposing sides of the switches. Consequently, the drain terminal of the high side switch and the source terminal of the low side switch of a pair may be laterally aligned with one another and the source terminal of the high side switch and the drain terminal of the low side switch of a pair are laterally aligned with one another, since the drain terminal of the high side switch and the drain terminal of the low side switch face in opposing lateral directions.

The half-bridge circuit may be formed by coupling one high side switch and one low side switch in series to form a pair and coupling two or more pairs in parallel between a common high voltage node and a common low voltage node. Each node of the pairs is coupled to a common output node.

If n high side switches and n low side switches are provided, n pairs are formed that are coupled in parallel between a common high voltage node and a common low voltage node.

The half-bridge circuit may be formed by coupling the drain terminal of the n high side switches to the high voltage node, a source terminal of n low side switches to the low voltage node and coupling the drain terminal of the n low side switches and the source terminal of the n high side switches to a common output connector. Thus, n high side switches and n low side switches are coupled in parallel between the high voltage node and the low voltage node and each of the pairs of high side switches and low side switches have a node that is coupled to a common output connector.

In embodiments in which the high side switch is provided by a first packaged transistor device and the low side switch is provided by a second packaged transistor device, the method may further comprise coupling a drain of the high side switch to the high voltage node by mounting a drain pin of the first packaged transistor device on a first conductive trace on the substrate. The source of the low side switch may be coupled to the low voltage node by mounting the source pin of the second packaged transistor device on a second conductive trace on the substrate, the second conductive trace being spaced apart from and electrically insulated from the first conductive trace. A source pin of the first packaged transistor device and a drain pin of the second packaged transistor device may be mounted on a common third conductive trace on the substrate which is coupled to the output connector. The third conductive trace provides the output node for this pair of switches. The first conductive trace is coupled to a high voltage connector and the high voltage node and the second conductive trace to a low voltage connector and the low voltage node. The third conductive trace provides the common output node.

In embodiments in which the high side switch is provided by a first bare transistor device die and the low side switch is provided by a second bare transistor device die, the method may further include coupling the drain of the high side switch to the high voltage node by mounting drain terminal of the first bare transistor device die on a fourth conductive trace on the substrate and coupling a source of the low side switch to the low voltage node. The source of the low side switch may be coupled to the low voltage node by an electrical connector such as one or more bond wires or a conductive clip, for example. The source of the first bare transistor device die may be coupled to a fifth conductive trace providing an output node that is positioned on the substrate and a drain of the second bare transistor device die may be mounted on the fifth conductive trace on the substrate in order to couple the source of the high side switch and the drain of the low side switch to the conductive fifth conductive trace and to a common output connector. The source terminal of the first bare transistor device die may be coupled to the fifth conductive trace by a conductive connector, such as one or more bond wires or a conductive clip. The fourth conductive trace is coupled to a high voltage connector and the high voltage node and the fifth conductive trace is coupled to the single common output connector.

Referring to FIG. 1, if, in a circuit arrangement in which the high side switches are arranged in a first row adjacent a high voltage buy and the low side switches are arranged in a second row adjacent a low voltage bus, each pair of switches is positioned at a different distance from cable connection point which can lead to uneven current sharing. Due to uneven current sharing, the switching devices will experience uneven temperature.

Increasing the number of paralleled switching devices with the aim of reducing the current and spread the heat, may not be sufficiently effective, since the board size increases and the disadvantages of the layout, i.e. different distances from the cable connection point, is increased.

The bypass capacitors may also be unevenly shared by the pairs and be less effective with increasing distance from the cable connection point. Adding more capacitors is, however, not so effective due to the increasing distance and fast switching cannot be effectively utilized. Additionally, the commutation loop has large parasitic inductance due to distance from the Drain of the high side switch to Source of the low side switch of the pair which may lead to excessive voltage overshoots.

The uniform lateral distribution of the switches about the common output connector according to one or more of the embodiments described herein provides a symmetrical layout and more equal current sharing between the switches, since the single output connector has the same distance from each pair of switches, allowing equal current flow in each pair of switches. Additionally, the space is optimized which enables the size of the board to be kept small. A single layer substrate, i.e. a substrate with a single conductive redistribution layer can be used which reduces costs, and provides good thermal performance and good utilization of conductive layer. The inductance loop may be minimized, and effectively compensated with the capacitors leading to the possibility of higher speed switching and improved efficiency due to reduced switching power loss.

The circuit arrangement is also expandable to any size and number of paralleled devices so that different application power requirements can be addressed.

Furthermore, the gate driver circuit may be optimized due to proximity to the gate pins of the switches and may be placed vertically and stacked on the substrate supporting the switches.

A vertical connection to the capacitor bank board can be provided that has a very low parasitic inductance between the power and cap board. A smaller distributed through hole header connector can be utilized instead of a few large power connectors leading to reduced overvoltage spikes, which in turn allows use of transistor devices with lower voltage rating which have lower conduction losses due to lower Rdson Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise. It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A circuit arrangement, comprising:
a half-bridge circuit comprising:
a high voltage node;
a low voltage node;
an output node;
wherein a high side switch and a low side switch are coupled in series and provide
a pair and n pairs are coupled in parallel between the high voltage node and the
low voltage node, n being an integer greater than or equal to 2,
a substrate having a major surface;
wherein the output node is provided by an output connector on the major surface of the substrate, the output connector having an axis perpendicular to the major surface of the substrate, and the n pairs are arranged on the major surface of the substrate and are uniformly distributed around the axis of the output connector.

2. The circuit arrangement of claim 1, wherein the n pairs are arranged on the major surface of the substrate around the axis such that adjacent ones of the n pairs are rotated by and angle α about the axis, where α=360°/n.

3. The circuit arrangement of claim 1, wherein a shortest line of sight between the high side switch and the output connector of the n pairs is substantially the same and such that a shortest line of sight between the low side switch and the output connector of the n pairs is substantially the same.

4. The circuit arrangement of claim 1, wherein the high side switches and low side switches are arranged alternately around the axis of the output connector.

5. The circuit arrangement of claim 1, wherein the high side switch and the low side switch of each pair comprise an indicator, wherein the indicators of the high side switch and the low side switch of each pair face in opposing lateral directions.

6. The circuit arrangement of claim 1, wherein the low side switch of each pair is provided by a transistor device having a drain terminal, a source terminal and a gate terminal, and wherein an edge of the drain terminal of each low side switch faces towards the output connector.

7. The circuit arrangement of claim 1, further comprising bypass capacitors, wherein each pair is associated with two bypass capacitors and the two bypass capacitors are arranged on opposing lateral sides of a low voltage connector of the low voltage node.

8. The circuit arrangement of claim 1, further comprising one or more driver circuits mounted on a driver substrate that is stacked on the substrate, and/or one or more capacitors mounted on a capacitor substrate that is stacked on the substrate.

9. A redistribution board, comprising:
the circuit arrangement of claim 1,
wherein each high side switch is provided by a packaged transistor device and each low side switch is provided by a packaged transistor device.

10. A module, comprising:
the circuit arrangement of claim 1,
wherein the high side switch is provided by a bare transistor device die and the low side switch is provided by a bare transistor device die.

11. The circuit arrangement of claim 1, wherein the output connector is a cylindrical structure that is disposed on the major surface and arranged centrally in between each of the n pairs, and wherein the axis is disposed at a centroid of the cylindrical structure.

12. The circuit arrangement of claim 1, wherein for each of the n pairs a central node is formed between the high side switch and the low side switch, and wherein the output connector is connected to the central node each of the n pairs.

* * * * *